US012371838B2

United States Patent
Lee et al.

(10) Patent No.: US 12,371,838 B2
(45) Date of Patent: Jul. 29, 2025

(54) SENSOR DEVICE AND ELECTRONIC DEVICE FOR ACQUIRING INFORMATION FROM SENSOR DEVICE

(71) Applicant: SAMSUNG ELECTRONICS CO., LTD., Suwon-si (KR)

(72) Inventors: Kyungwoo Lee, Suwon-si (KR); Taedong Goh, Suwon-si (KR); Daehyun Kim, Suwon-si (KR); Jinbong Lee, Suwon-si (KR); Jihoon Jung, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 173 days.

(21) Appl. No.: 18/131,491

(22) Filed: Apr. 6, 2023

(65) Prior Publication Data

US 2023/0243082 A1  Aug. 3, 2023

Related U.S. Application Data

(63) Continuation of application No. PCT/KR2021/014004, filed on Oct. 12, 2021.

(30) Foreign Application Priority Data

Oct. 12, 2020 (KR) .................. 10-2020-0131424

(51) Int. Cl.
*G01R 11/63* (2006.01)
*D06F 34/05* (2020.01)
(Continued)

(52) U.S. Cl.
CPC .............. *D06F 34/08* (2020.02); *D06F 34/05* (2020.02); *D06F 34/10* (2020.02); *D06F 34/18* (2020.02);
(Continued)

(58) Field of Classification Search
CPC .......... D06F 34/05; D06F 34/08; D06F 34/10; D06F 34/14; D06F 34/18; D06F 34/22;
(Continued)

(56) References Cited

U.S. PATENT DOCUMENTS

| 11,715,968 B2* | 8/2023 | Rodrigues Mansano ..................... H02J 7/0071 307/23 |
| 2005/0015891 A1* | 1/2005 | Koo ......................... D06F 34/18 8/159 |

(Continued)

FOREIGN PATENT DOCUMENTS

| JP | 2016-177769 A | 10/2016 |
| JP | 2018-143646 A | 9/2018 |

(Continued)

OTHER PUBLICATIONS

International Search Report (PCT/ISA/210) issued by the International Searching Authority on Jan. 14, 2022 in corresponding International Application No. PCT/KR2021/014004.
(Continued)

*Primary Examiner* — Thang X Le
(74) *Attorney, Agent, or Firm* — Sughrue Mion, PLLC

(57) ABSTRACT

According to various embodiments, a sensor device may comprise: an energy harvester configured to generate electrical energy; an energy storage circuit configured to store the generated electrical energy; a monitoring circuit; a sensor; a communication circuit; and at least one processor, wherein the at least one processor is configured to identify a voltage of the energy storage circuit through the monitoring circuit, operate in a first mode in response to identification that the voltage is equal to or lower than a threshold value, operate in a second mode which consumes more power than the first mode, in response to identification that the voltage exceeds the threshold value, acquire a sensing
(Continued)

value through the sensor according to a sensing scheme corresponding to one of the first mode and the second mode, and control the communication circuit to transmit the voltage and the sensing value to another electronic device according to the communication scheme corresponding to one of the first mode and the second mode. Various other embodiments are possible.

15 Claims, 13 Drawing Sheets

(51) Int. Cl.
| | | |
|---|---|---|
| *D06F 34/08* | (2020.01) | |
| *D06F 34/10* | (2020.01) | |
| *D06F 34/18* | (2020.01) | |
| *D06F 34/22* | (2020.01) | |
| *D06F 34/26* | (2020.01) | |
| *D06F 34/28* | (2020.01) | |
| *G01R 13/02* | (2006.01) | |
| *G01R 19/165* | (2006.01) | |
| *H02J 7/00* | (2006.01) | |
| *H02J 50/00* | (2016.01) | |
| *H02J 50/10* | (2016.01) | |
| *D06F 103/04* | (2020.01) | |
| *D06F 103/20* | (2020.01) | |
| *D06F 103/22* | (2020.01) | |
| *D06F 103/32* | (2020.01) | |
| *D06F 103/34* | (2020.01) | |

(52) U.S. Cl.
CPC .............. *D06F 34/22* (2020.02); *D06F 34/26* (2020.02); *D06F 34/28* (2020.02); *G01R 13/0281* (2013.01); *G01R 19/16566* (2013.01); *H02J 7/0047* (2013.01); *H02J 7/007* (2013.01); *H02J 50/001* (2020.01); *H02J 50/10* (2016.02); *D06F 2103/04* (2020.02); *D06F 2103/20* (2020.02); *D06F 2103/22* (2020.02); *D06F 2103/32* (2020.02); *D06F 2103/34* (2020.02)

(58) Field of Classification Search
CPC ...... D06F 34/26; D06F 34/28; D06F 2103/04; D06F 2103/20; D06F 2103/22; D06F 2103/32; D06F 2103/34; H02J 7/007; H02J 50/001; H02J 50/10; H02J 50/80; G01R 19/165; G01R 19/16566; G01R 13/0281

See application file for complete search history.

(56) References Cited

U.S. PATENT DOCUMENTS

| | | | |
|---|---|---|---|
| 2012/0256492 A1 | 10/2012 | Song et al. | |
| 2013/0141067 A1* | 6/2013 | Huang | ............... G05F 1/67 |
| | | | 323/282 |
| 2015/0128661 A1* | 5/2015 | Jung | ............... D06F 34/10 |
| | | | 318/400.11 |
| 2015/0346233 A1 | 12/2015 | Slepov | |
| 2016/0057599 A1 | 2/2016 | Lim et al. | |
| 2016/0069332 A1 | 3/2016 | Jaatinen | |
| 2017/0237466 A1* | 8/2017 | Carr | ............... H02J 50/12 |
| | | | 455/41.1 |
| 2018/0087208 A1 | 3/2018 | Lee et al. | |
| 2018/0223467 A1* | 8/2018 | Hoshino | ............ D06F 37/12 |

FOREIGN PATENT DOCUMENTS

| | | |
|---|---|---|
| KR | 10-2016-0024426 A | 3/2016 |
| KR | 10-2016-0039872 A | 4/2016 |
| KR | 10-2018-0098041 A | 9/2018 |
| KR | 10-2018-0128599 A | 12/2018 |
| KR | 10-2019-0021742 A | 3/2019 |
| KR | 10-2019-0021743 A | 3/2019 |
| KR | 10-2019-0022424 A | 3/2019 |
| WO | 2007/004173 A1 | 1/2007 |

OTHER PUBLICATIONS

Written Opinion (PCT/ISA/237) issued by the International Searching Authority on Jan. 14, 2022 in corresponding International Application No. PCT/KR2021/014004.

* cited by examiner

SENSOR DEVICE AND ELECTRONIC DEVICE FOR ACQUIRING INFORMATION FROM SENSOR DEVICE

CROSS-REFERENCE TO RELATED APPLICATIONS

This application is a by-pass continuation of International Application No. PCT/KR2021/014004, filed on Oct. 12, 2021, which is based on and claims priority to Korean Patent Application No. 10-2020-0131424, filed on Oct. 12, 2020, in the Korean Intellectual Property Office, the disclosures of which are incorporated by reference herein in their entireties.

BACKGROUND

1. Field

The disclosure relates to a sensor device and an electronic device that obtains information from the sensor device; and, more particularly, to a sensor device that detects a sensing value related to operation of the electronic device and an electronic device that obtains a sensing value related to operation of the electronic device from the sensor device.

2. Description of Related Art

A sensor device that obtains a sensing value related to operation of an electronic device has been widely popularized. For example, a washing machine may include a door sensor to check whether a door is closed before starting operation and a water level sensor to detect the height of water in order to maintain a water level suitable for doing the laundry. In addition, a drying machine containing a humidity sensor may identify whether laundry is sufficiently dried based on a humidity value obtained from the humidity sensor.

In the case of an existing sensor device that obtains a sensing value related to operation of an electronic device, the sensor device may be embedded in the electronic device as a part of the electronic device and may be coupled to the electronic device as a single entity. Therefore, the existing sensor device is incapable of obtaining a sensing value in a place that is distant from the surface of the electronic device. For example, in the case of a drying machine containing a humidity sensor, although a humidity sensor is disposed closest to laundry, the humidity sensor is disposed in an inner surface of the drying machine and thus, a humidity value between laundry distant from the inner surface of the drying machine may not be obtained. Therefore, the existing sensor device may have a problem in that a sensing value detected by the sensor device has a difference from an actually required sensing value.

There is a need for a sensor device that is not embedded in the electronic device and is a separate device from the electronic device. Such a sensor device may produce electric energy via an energy harvester, may obtain a sensing value via a sensor, and may transmit the sensing value to another electronic device.

SUMMARY

Provided is a sensor device that may include an energy harvester configured to produce electric energy, an energy storage circuit configured to store the produced electric energy, a monitoring circuit, a sensor, a communication circuit, and at least one processor, and the at least one processor is configured to identify a voltage of the energy storage circuit via the monitoring circuit, to operate in a first mode in response to identifying that the voltage is less than or equal to a threshold value, to operate in a second mode that consumes a higher amount of power than the first mode in response to identifying that the voltage exceeds the threshold value, to obtain a sensing value via the sensor according to a sensing scheme corresponding to one of the first mode or the second mode, and to control the communication circuit so as to transmit the voltage and the sensing value to another electronic device according to a communication scheme corresponding to one of the first mode or the second mode.

According to an aspect of the disclosure, a sensor device includes: an energy harvester configured to produce electric energy; an energy storage circuit configured to store the produced electric energy; a monitoring circuit; a sensor; a communication circuit; and at least one processor configured to: identify a voltage of the energy storage circuit via the monitoring circuit, operate in a first mode in response to identifying that the voltage is less than or equal to a threshold value, operate in a second mode that consumes a higher amount of power than the first mode in response to identifying that the voltage exceeds the threshold value, based on operating in the first mode, obtain a first sensing value via the sensor according to a first sensing scheme corresponding to the first mode and control the communication circuit to transmit the voltage and the first sensing value to another electronic device according to a communication scheme corresponding to the first mode, and based on operating in the second mode, obtain a second sensing value via the sensor according to a second sensing scheme corresponding to the second mode and control the communication circuit to transmit the voltage and the second sensing value to the other electronic device according to a communication scheme corresponding to the second mode.

The at least one processor of the sensor device may be further configured to: based operating in the first mode, obtain the first sensing value via the sensor during a first sensing period according to the first sensing scheme, and based on operating in the second mode, obtain the second sensing value via the sensor during a second sensing period that may be shorter than the first sensing period according to the second sensing scheme.

The at least one processor of the sensor device may be further configured to: based on operating in the first mode, control the communication circuit to transmit the voltage and the first sensing value to the other electronic device during a first transmission period according to a communication scheme corresponding to the first mode, and based on operating in the second mode, control the communication circuit to transmit the voltage and the second sensing value to the other electronic device during a second transmission period that may be shorter than the first transmission period according to a communication scheme corresponding to the second mode.

The at least one processor of the sensor device may be further configured to: based on operating in the first mode, control the communication circuit to transmit the voltage and the first sensing value to the other electronic device via a signal having a first intensity, and based on operating in the second mode, control the communication circuit to transmit the voltage and the second sensing value to the other electronic device via a signal having a second intensity that may be greater than the first intensity.

The sensor device may further include: a bleeder circuit which may include an LED and a Zener diode, wherein the LED may be configured to emit light based on the voltage exceeding the threshold value.

The energy harvester may include a magnetic field induction harvester which may include: a guide disposed in a housing of the sensor device, a magnet configured to be movable in the guide according to a movement of the housing, and a coil winding around the guide, and wherein the coil may include at least one of a single coil-wound portion disposed within the guide or two or more coil-wound portions disposed within the guide and spaced apart from one another.

The guide may be disposed in a straight direction, and the magnetic field induction harvester may further include a single guide.

The energy harvester may also include at least one from among a piezoelectric harvester, a thermoelectric harvester, a triboelectrification harvester, a photoelectric harvester, an RF harvester, a vibration energy harvester, a rotation energy harvester, and a kinetic energy harvester.

The sensor may include at least one from among a temperature sensor, a humidity sensor, an acceleration sensor, a gyro sensor, a detergent amount sensor, a pH sensor, a contamination level sensor, a turbidity level sensor, and an odor sensor.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
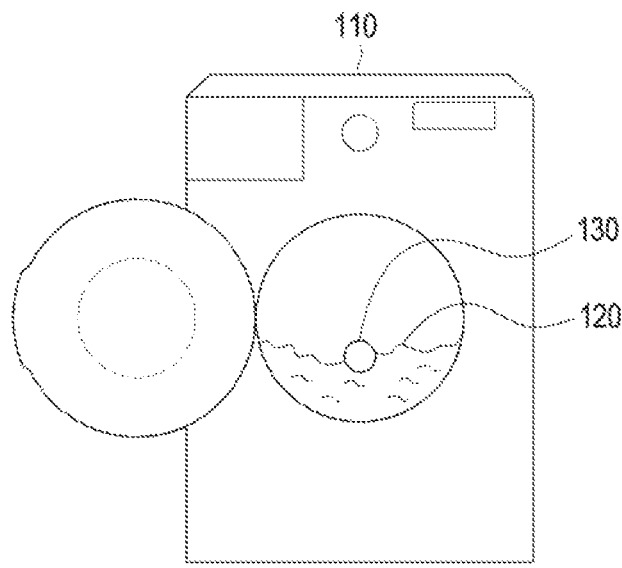
FIG. 1 is a diagram illustrating a case in which an electronic device and a sensor device are utilized according to various embodiments.

FIG. 1 is a diagram illustrating a case in which an electronic device and a sensor device are utilized according to various embodiments. In FIG. 1, an electronic device 110 may be a washing machine or a drying machine. The electronic device 110 may accommodate laundry 120 and a sensor device 130 therein. The sensor device 130 may be located in the laundry 120. As described below, according to various embodiments, after operation of the electronic device 110 begins, the sensor device 130 may obtain a sensing value in the laundry 120. According to various embodiments, the sensor device 130 may convert energy produced as the electronic device 110 operates into electric energy so as to produce electric energy, and may store the produced electric energy in an energy storage circuit. For example, when an actuator of the electronic device 110 is driven, the sensor device 130 may move inside the electronic device 110. In this instance, an internal magnet of the electronic device 110 may move, and an induced electromotive force may be produced along with the movement of the magnet. The sensor device 130 may convert various types of energy (kinetic energy, thermal energy, light energy) caused by the electronic device 110 or an external environment as described above into electric energy. According to various embodiments, the sensor device 130 may identify a voltage of an energy storage circuit, and may operate one of a first mode or a second mode according to the voltage of the energy storage circuit. According to various embodiments, the sensor device 130 may include a sensor that is driven by energy stored in the energy storage circuit, and may obtain a sensing value using a sensor according to a sensing scheme corresponding to one of the first mode or the second mode. According to various embodiments, the sensor device 130 may transmit a voltage of the energy storage circuit and a sensing value to the electronic device 110 according to a sensing scheme corresponding to one of the first mode or the second mode. The electronic device 110 may identify the weight or volume of the laundry 120 based on the voltage of the energy storage circuit. According to various embodiments, the electronic device 110 may control an actuator based on at least one of the weight of the laundry 120, the volume of the laundry 120, and a sensing value.

Figure 2:
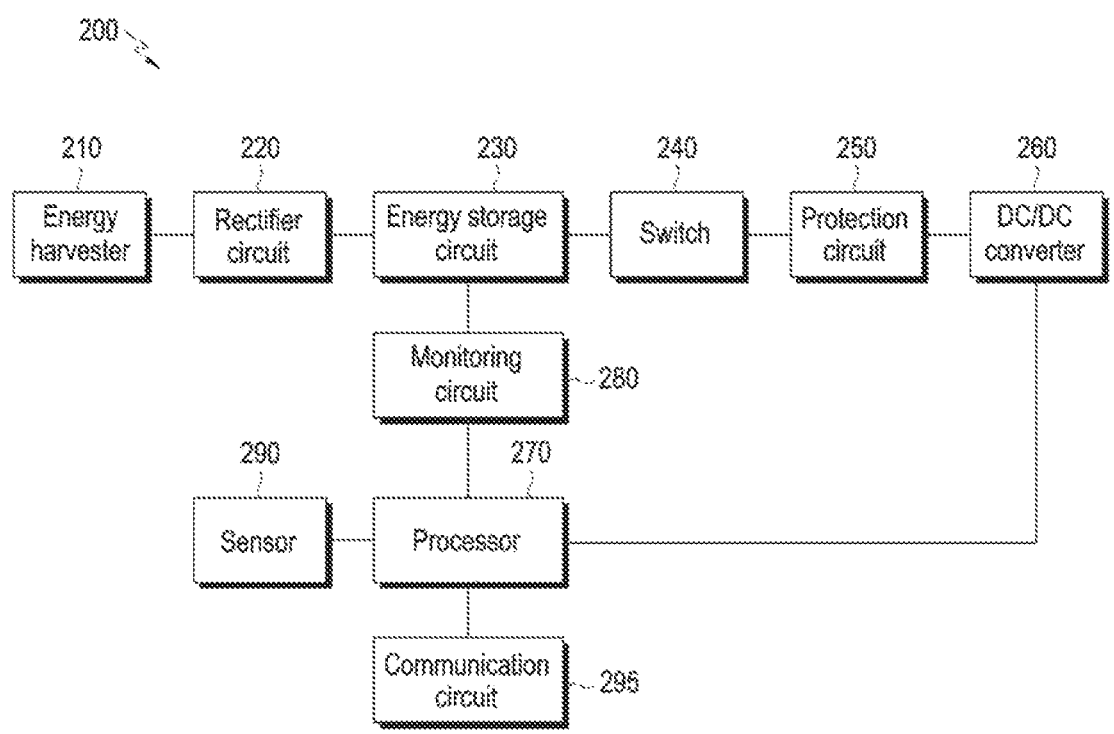
FIG. 2 is a block diagram of a sensor device according to various embodiments.

FIG. 2 is a block diagram of a sensor device according to various embodiments. Referring to FIG. 2, a sensor device 200 may include an energy harvester 210, a rectifier circuit 220, an energy storage circuit 230, a switch 240, a protection circuit 250, a DC/DC converter 260, a processor 270, a monitoring circuit 280, a sensor 290, and a communication circuit 295.

According to various embodiments, the energy harvester 210 may convert energy other than electric energy into electric energy. According to various embodiments, the energy harvester 210 may include a magnetic field induction harvester. According to various embodiments, the energy harvester 210 may further include at least one of a piezoelectric harvester, a thermoelectric harvester, a triboelectrification harvester, a photoelectric harvester, an RF harvester, or a vibration energy harvester. The structure of a magnetic field induction harvester will be described below with reference to FIGS. 3A and 3B. The piezoelectric harvester may include a piezoelectric element, and may produce electric energy when external mechanical force is applied to the piezoelectric element. The thermoelectric harvester includes a thermoelectric element, and the thermoelectric element may convert thermal energy into electric energy. The triboelectrification harvester may include an electrode for absorbing electricity caused by friction. The photoelectric harvester may include a photoelectric element, and the photoelectric element may convert light energy into electric energy. According to various embodiments, the photoelectric element may be disposed an outer surface of the sensor device 200. The RF harvester may include a wire for collecting electromagnetic waves. Vibration energy harvester may convert mechanical energy produced by vibration and/or rotary motion into electric energy. The magnetic field induction harvester, the piezoelectric harvester, the thermoelectric harvester, the triboelectrification harvester, the RF harvester, and the vibration energy harvester may produce electric energy in an alternating current (AC) form, and the photoelectric harvester may produce electric energy in a direct current (DC) form.

According to various embodiments, the rectifier circuit 220 may convert electric energy in the AC form output from the energy harvester 210 into electric energy in the DC form. Depending on implementation, the rectifier circuit 220 may adjust a voltage and/or current of rectified electric energy and may output the same.

According to various embodiments, the sensor device 200 may include the energy storage circuit 230. The energy storage circuit 230 may be connected to an output end of the rectifier circuit 220, and may store electric energy in the DC form. According to various embodiments, the energy storage circuit 230 may include at least one of a battery, a capacitor, or a super-capacitor. According to various embodiments, in the case that the energy storage circuit 230 includes a battery, the energy storage circuit 230 may further include a capacitor for rectifying a current input into the battery. According to various embodiments, in the case that the energy storage circuit 230 includes a battery, the energy storage circuit 230 may further include an integrated circuit (IC) for charging a battery or a power management integrated circuit (PMIC).

Figure 7A:
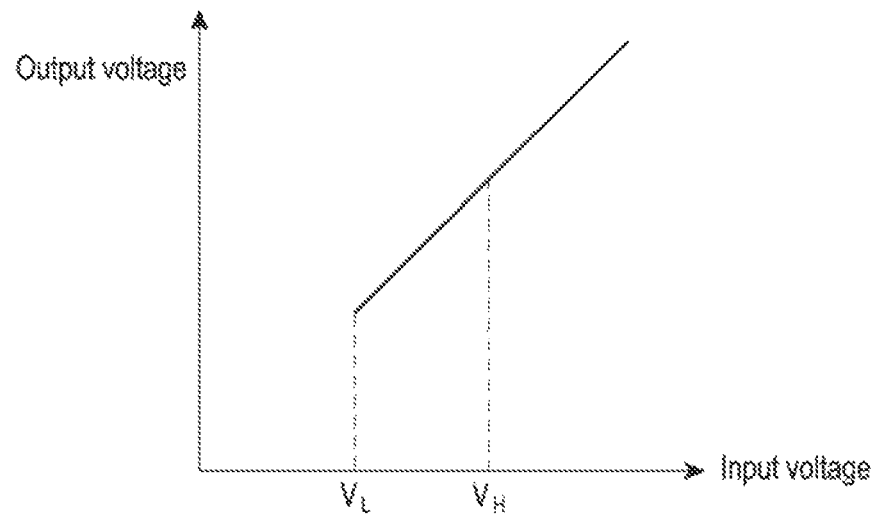
FIGS. 7A and 7B are illustrating operation of a hysteresis switch according to various embodiments.

According to various embodiments, the switch 240 may be a hysteresis switch to be described with reference to FIGS. 7A and 7B. According to various embodiments, the switch 240 may be a normal switch that does not output a voltage when a single reference voltage is used and an input voltage is less than the reference voltage, and outputs a voltage when an input voltage is greater than or equal to the reference voltage. The switch 240 may transfer energy stored in the energy storage circuit 230 to the processor 270 via the protection circuit 250 and the DC/DC converter 260, or may block the energy. According to various embodiments, in the case that an abnormal situation occurs or insufficient magnitude of electric energy is produced for operation of the processor 270 or the sensor 290, the switch 240 may block supplying power to the processor 270.

According to various embodiments, the protection circuit 250 may be connected to an input end of the switch 240 or an output end of the switch 240. According to various embodiments, a protection circuit 250b may include a Zener diode.

According to various embodiments, the DC/DC converter 260 may convert a voltage of power transferred via the switch 240 and the protection circuit 250 to a voltage to be used for the processor 270.

According to various embodiments, the sensor device 200 may include the processor 270. According to various embodiments, the processor 270 may be a single processor or may be a plurality of processors. The processor 270 may execute, for example, software so as to control at least one other component element (e.g., a hardware or software component element) of the sensor device 200, and may perform various data processing or various operations. According to an embodiment, at least a part of the data processing or operations, the processor 270 may load commands or data received from another component element (e.g., the sensor 290 or the communication circuit 295) in volatile memory, may process commands or data stored in the volatile memory, and may store result data in non-volatile memory. According to an embodiment, the processor 270 may include a main processor (e.g., a central processing device or application processor), and a sub-processor (e.g., a graphic processing device, an image signal processor, a sensor hub processor, or a communication processor) that are capable of operating independently or together. Additionally or alternatively, the sub-processor may be configured to use lower power than the main processor, or may be configured to specialized for a designated function.

According to various embodiments, the monitoring circuit 280 may include a voltmeter, and may identify a voltage of the energy storage circuit 230. According to various embodiments, the monitoring circuit 280 may include an analog to digital converter (ADC) circuit. The monitoring circuit 280 may be connected to the processor 270, and may transfer a detected value to the processor 270.

According to various embodiments, the sensor 290 may sense an external environment state of the sensor device 200, and may produce an electric signal or data value corresponding to the sensed state. According to various embodiments, the sensor 290 may include, for example, at least one from among a temperature sensor, a humidity sensor, an acceleration sensor, a gyro sensor, a detergent amount sensor, or a turbidity level sensor. For example, the detergent amount sensor may include a pair of electrodes for measuring electrical conductance in wash water, and the amount of detergent may be detected based on an electrical conductance of wash water that varies depending on the amount of detergent dissolved in the water. For example, the turbidity level sensor may detect a turbidity level by measuring a penetration ratio and scattering ratio of light that varies depending on the amount of particles that dissolves in the water.

For example, the sensor 290 may include at least one of a temperature sensor, a humidity sensor, an acceleration sensor, and a gyro sensor in order to produce a sensing value related to operation of a drying machine. According to another embodiment, the sensor 290 may include at least one from among a temperature sensor, a humidity sensor, an acceleration sensor, a gyro sensor, a detergent amount sensor, a pH sensor, an odor sensor, a contamination level sensor, or a turbidity level sensor, in order to produce a sensing value related to operation of a washing machine. According to another embodiment, in order to produce a sensing value related to operation of a drying machine and a washing machine, the sensor 290 may include at least one from among a temperature sensor, a humidity sensor, an acceleration sensor, and a gyro sensor, and may or may not include a detergent amount sensor, a pH sensor, a contamination level sensor, or a turbidity level sensor.

According to various embodiments, the communication circuit 295 may be used for transmitting, to an electronic device (e.g., the electronic device 110), a signal indicating a sensing value obtained via the sensor 290 and indicating a voltage of the energy storage circuit 230 obtained via the monitoring circuit 280. According to various embodiments, the communication circuit 295 may perform Bluetooth low energy (BLE), Bluetooth, Zigbee, Wi-Fi, or infra-red (IR) communication. According to various embodiments, the communication circuit 295 may be embodied as a chip identical to the processor 270.

The communication circuit 295 may establish a wireless communication channel between the sensor device 200 and an external electronic device (e.g., the electronic device 110), and may support performing communication via the established communication channel. The communication circuit 295 may include one or more communication processors that operate independently from the processor 270 (e.g., an application processor), and support wireless communication. According to an embodiment, the communication circuit 295 may include a wireless communication circuit (e.g., a cellular communication circuit, a short-range wireless communication circuit, or a global navigation satellite system (GNSS) communication circuit). A corresponding communication circuit among the communication circuits may communicate with an external electronic device via a first network (e.g., a short-range communication network such as Bluetooth, WiFi direct, or infrared data association (IrDA)) or a second network (e.g., a long-range communication network such as a cellular network, the Internet, or a computer network (e.g., LAN or WAN)). Various types of communication circuits may be integrated as a single component element (e.g., a single chip), or may be embodied as a plurality of different component elements (e.g., a plurality of chips). A wireless communication circuit may identify and authenticate the sensor device 200 in a communication network such as a first network or a second network using subscriber information (e.g., international mobile subscriber identification (IMSI)) stored in a subscriber identification module.

Figure 3A:
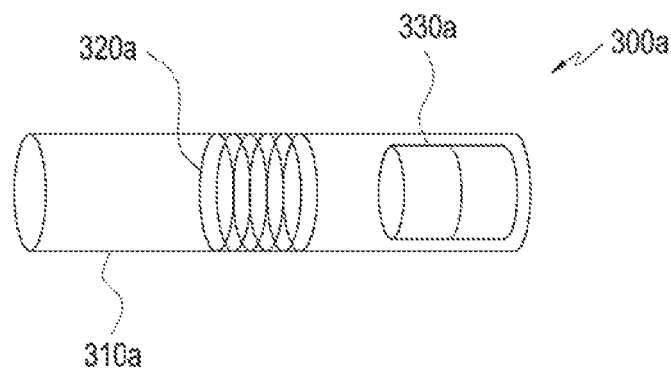
FIGS. 3A and 3B are diagrams illustrating magnetic field induction harvesters according to various embodiments.

FIG. 3A is a diagram illustrating the structure of a magnetic field induction harvester according to various embodiments. A magnetic field induction harvester 300a according to various embodiments may include a guide 310a, a coil 320a winding around the guide, and a magnet 330a disposed to be movable in the guide. The magnet 330a may be movable in the guide along with a movement of the magnetic field induction harvester 300a, and when the magnet 330a passes a portion of the guide 310a where the coil 320a is disposed, induced electromotive force may be produced in the coil 320a due to a change in magnetic flux of one section of the coil 320a.

In the example of FIG. 3A, the guide 310a may be provided in a cylinder shape. In addition, all the sizes of the guide 310a, the coil 320a, and the magnet 330a illustrated in FIG. 3A are provided for illustrative purposes. According to various embodiments, the magnetic field induction harvester 300a may include a plurality of coils 320a. According to various embodiments, the magnet 330a may be provided in an oval shape. According to various embodiments, the magnet 330a may be provided in a shape and a size that do not allow overturning in the guide 310a.

Figure 3B:
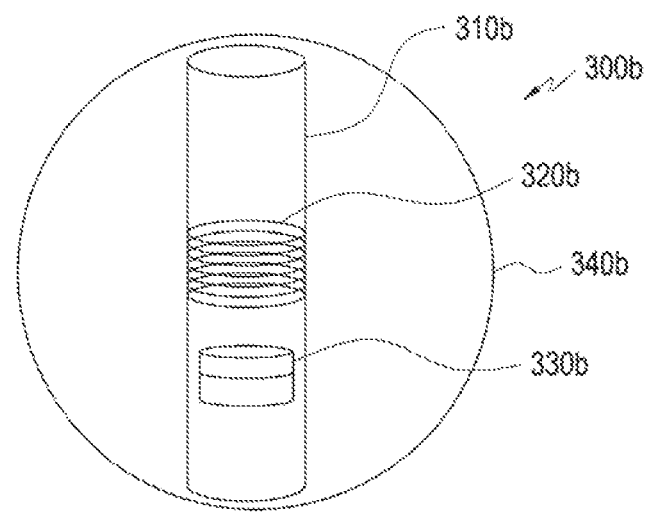

FIG. 3B is a diagram illustrating the structure of a housing including a magnetic field induction harvester disposed therein according to various embodiments. In a sensor device 300b illustrated in FIG. 3B, the magnetic field induction harvester including the guide 310b, the coil 320b, and the magnet 330b may be disposed in a housing 340b of the sensor device 300b. According to various embodiments, the housing 340b of the sensor device 300b may be provided in a spherical shape. According to various embodiments, the housing 340b of the sensor device 300b may be provided in various three-dimensional shapes such as hexahedron, a tetrahedron, elliptical sphere, rugby ball shape, and the like. The detailed items of the magnetic field induction harvester illustrated in FIG. 3B are the same as the description provided with reference to FIG. 3A and thus a duplicate description is omitted.

Figure 4:
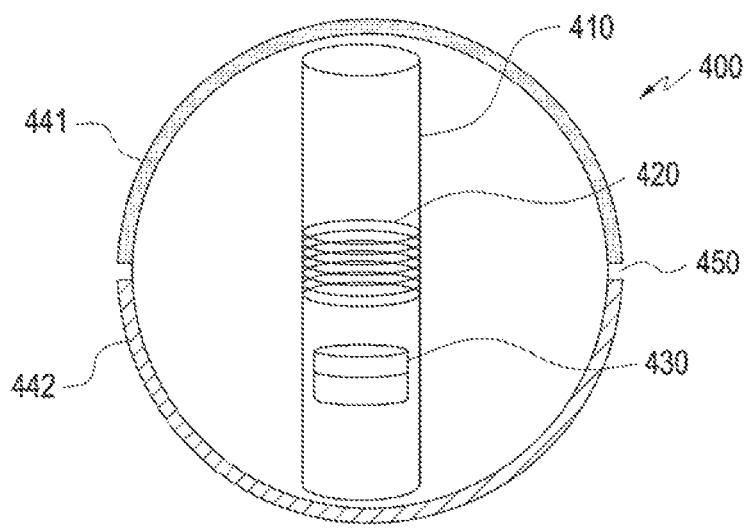
FIG. 4 is a diagram illustrating the structure of an energy harvester including a magnetic field induction harvester and a triboelectrification harvester according to various embodiments.

FIG. 4 is a diagram illustrating the structure of an energy harvester including a magnetic field induction harvester and a triboelectrification harvester according to various embodiments. According to various embodiments, a sensor device 400 may include triboelectrification electrodes 441 and 442 disposed the outer surface of a housing 450. The triboelectrification electrodes 441 and 442 may be included in a triboelectrification harvester that harvests electric energy produced by friction occurring between the sensor device 400 and an adjacent object. According to various embodiments, the sensor device 400 may include, in the housing 450, a guide 410, a coil 420 winding around the guide 410, and a magnet 430 disposed to be movable in the guide. As described above, the guide 410, the coil 420, and the magnet 430 may be included in a magnetic field induction harvester.

Figure 5:
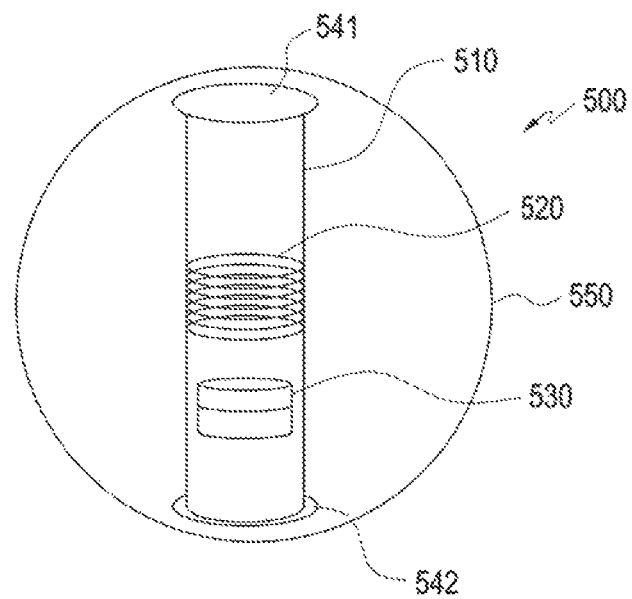
FIG. 5 is a diagram illustrating the structure of an energy harvester including a magnetic field induction harvester and a piezoelectric harvester according to various embodiments.

FIG. 5 is a diagram illustrating the structure of an energy harvester including a magnetic field induction harvester and a piezoelectric harvester according to various embodiments. According to various embodiments, a sensor device 500 may include, in a housing 550, a guide 510, a coil 520 winding around the guide 510, and a magnet 530 disposed to be movable in the guide 510. As described above, the guide 510, the coil 520, and the magnet 530 may be included in a magnetic field induction harvester. According to various embodiments, piezoelectric devices 541 and 542 may be disposed in both ends of the guide 510 included in the sensor device 500. The piezoelectric devices 541 and 542 may be included in a piezoelectric harvester. According to various embodiments, in the case that the magnet 530 moves along with a movement of the housing 550 of the sensor device 500 and is in contact with the piezoelectric device 541 and 542, the piezoelectric device 541 and 542 may produce electric energy using this mechanical force.

Figure 6:
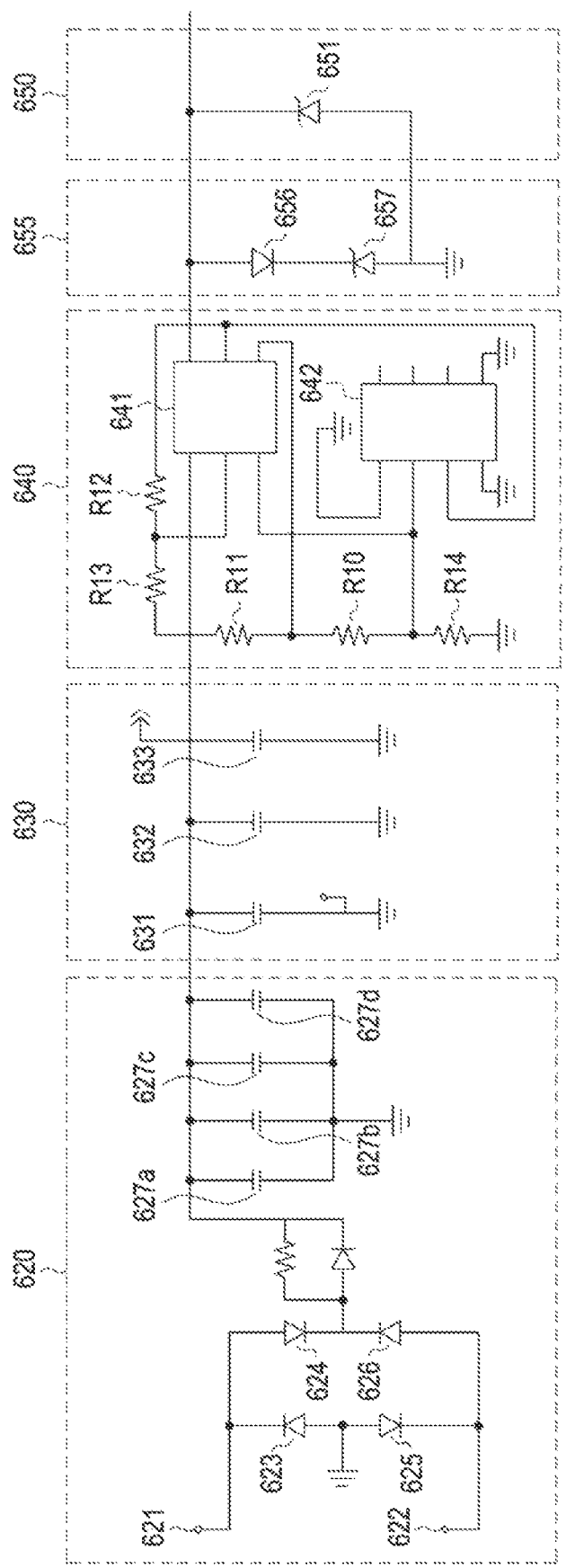
FIG. 6 is a circuit diagram of component elements of a sensor device according to various embodiments.

FIG. 6 is a circuit diagram of a few component elements of a sensor device according to various embodiments. Specifically, FIG. 6 illustrates the rectifier circuit 220, the energy storage circuit 230, the switch 240, and the protection circuit 250 as illustrated in FIG. 2. Referring to FIG. 6, a rectifier circuit 620 corresponds to the rectifier circuit 220 of FIG. 2, an energy storage circuit 630 corresponds to the energy storage circuit 230 illustrated in FIG. 2, a switch 640 corresponds to the switch 240 of FIG. 2, and a protection circuit 650 corresponds to the protection circuit 250 of FIG. 2. In the example of FIG. 6, although it is illustrated that a sensor device further includes a bleeder circuit 655 between the switch 640 and the protection circuit 650, the sensor device may not include the bleeder circuit 655 according to various embodiments.

According to various embodiments, the rectifier circuit 620 may include terminals 621 and 622 for connection to an energy harvester (e.g., the energy harvester 210). The rectifier circuit 620 may include a bridge rectifier including a plurality of diodes 623, 624, 625, and 626. According to various embodiments, the rectifier circuit 620 may further include a plurality of capacitors 627a, 627b, 627c, and 627d. The rectifier circuit 620 may convert AC power produced from an energy harvester into DC power.

According to various embodiments, the energy storage circuit 630 may include a plurality of capacitors 631, 632, and 633. According to various embodiments, the plurality of capacitors 631, 632, and 633 may store energy based on power converted by the rectifier circuit 620. According to various embodiments, the plurality of capacitors 631, 632, and 633 are connected in parallel, and thus, a voltage of one of the plurality of capacitors 631, 632, and 633 may be identified as a voltage of the energy storage circuit 630.

According to various embodiments, the switch 640 may be a hysteresis switch as illustrated in FIG. 6. The switch 640 may include a plurality of resistances R10, R11, R12, R13, and R14, a two p-channel FET 641, and a single n-channel FET 642. According to various embodiments, the source of a first p-channel FET of the two p-channel FET 641 may be the input end of the switch 640, and may be connected between R11 and R13. The drain of the first p-channel FET may be the output end of the switch 640 and the gate of the first p-channel FET may be connected between R13 and R12. The source of a second p-channel FET of the two p-channel FET 641 may be connected between R10 and R11, the drain of the second p-channel FET may be connected to the gate of the n-channel FET 642 and may also be connected between R10 and R14, and the gate of the second p-channel FET may be connected to the drain of the n-channel FET 642. The source of the n-channel FET 642 may be connected to a ground. FIGS. 7A and 7B are diagrams illustrating operation of a hysteresis switch according to various embodiments. Referring to FIG. 7A, in the case that an input voltage is lower than $V_L$, an output voltage is 0. In the case that an input voltage is a value lower than $V_L$, and subsequently, is increased and happens to have a value higher than $V_L$ and lower than $V_H$, an output voltage is still 0. When an input voltage is higher than $V_H$, an output voltage may be identical to the input voltage. In the case that an input voltage is a value higher than $V_H$, and subsequently is decreased and happens to have a value higher than $V_L$ and lower than $V_H$, an output voltage is identical to the input voltage.

Figure 7B:
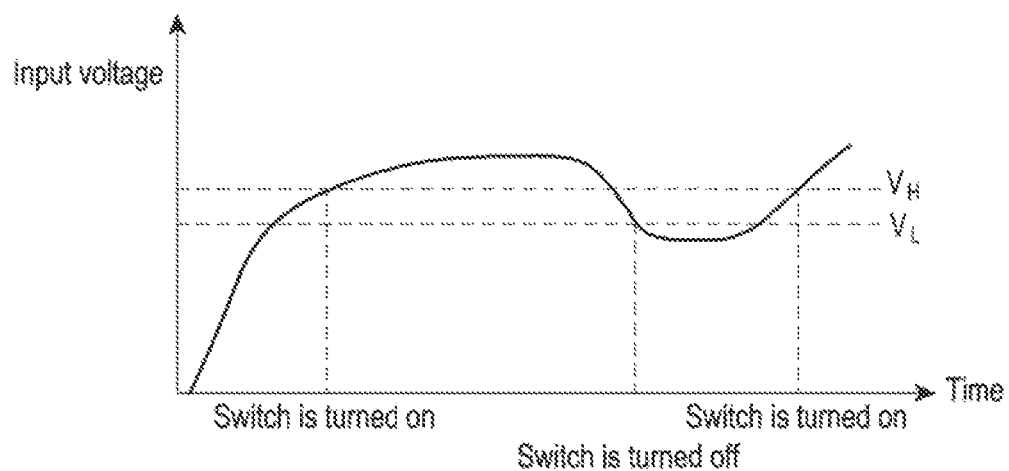

FIG. 7B is a graph illustrating an operating state of a hysteresis switch in the case that an input voltage rises and falls over time starting from 0. In the section in which an input voltage starts from 0 and is increased, the hysteresis switch is turned off at the point at which the input voltage is $V_H$. Subsequently, the input voltage has been a value higher than $V_H$ and is decreased. In the section in which the input voltage has been a value higher than $V_H$ and is decreased, the hysteresis switch is turned off at the point at which the input voltage is $V_L$. Subsequently, the input voltage has been a value lower than $V_L$ and is increased. In the section in which the input voltage has been a value lower than $V_L$ and is increased, the hysteresis switch is turned on at the point in time at which the input voltage is $V_H$.

According to various embodiments, $V_L$ may be set to the minimum value capable of driving a processor. In the case that an input voltage is decreased when the hysteresis switch is in the turned-on state, the above-described hysteresis switch may delay the point in time at which the switch is to be turned off. In the case that an input voltage is increased when the hysteresis switch is in the turned-off state, the hysteresis switch may delay the point in time at which the switch is to be turned on. Therefore, in the case that an output power of an energy harvester is decreased, the hysteresis switch may delay the point in time at which power is not to be supplied to the processor. In the case that an output power of an energy harvester is increased, the hysteresis switch may delay the point in time at which power is to be supplied to the processor until power is more accumulated to an energy storage device so that power is supplied to the processor during a longer period of time. In addition, when the size of a harvesting energy is changed, the processor and the communication circuit are prevented from being frequently turned on/off. Accordingly, reliable communication connection between the sensor device and the electronic device may be guaranteed.

According to various embodiments, the bleeder circuit 655 may increase the amount of power consumption when a voltage of the energy storage circuit 630 exceeds a threshold value. The bleeder circuit 655 may include an LED 656 and a Zener diode 657. In the case that a voltage of the energy storage circuit 630 is less than or equal to a Zener voltage of the Zener diode 657, a current may not flow through the LED 656. In the case that a voltage of the energy storage circuit 630 exceeds a Zener voltage of the Zener diode 657, a current may flow through the LED 656 and accordingly, the LED 656 emit light and increases the amount of power consumed. According to various embodiments, a voltage of the energy storage circuit 630 exceeds a threshold by adapting the Zener diode 657 that has a Zener voltage as a threshold value for increasing the amount of power consumption, the amount of power consumed may be increased.

According to various embodiments, the protection circuit 650 may include the Zener diode 651, and the Zener diode 651 may have a structure of being connected to a grounding end. According to various embodiments, a Zener voltage of the Zener diode 651 may be higher than a Zener voltage of the Zener diode 657. In the case that a voltage of the output end of the switch 640 is higher than a Zener voltage of the Zener diode 651, the protection circuit 650 may enable a current to flow to a grounding end and may protect a sensor device.

Figure 8:
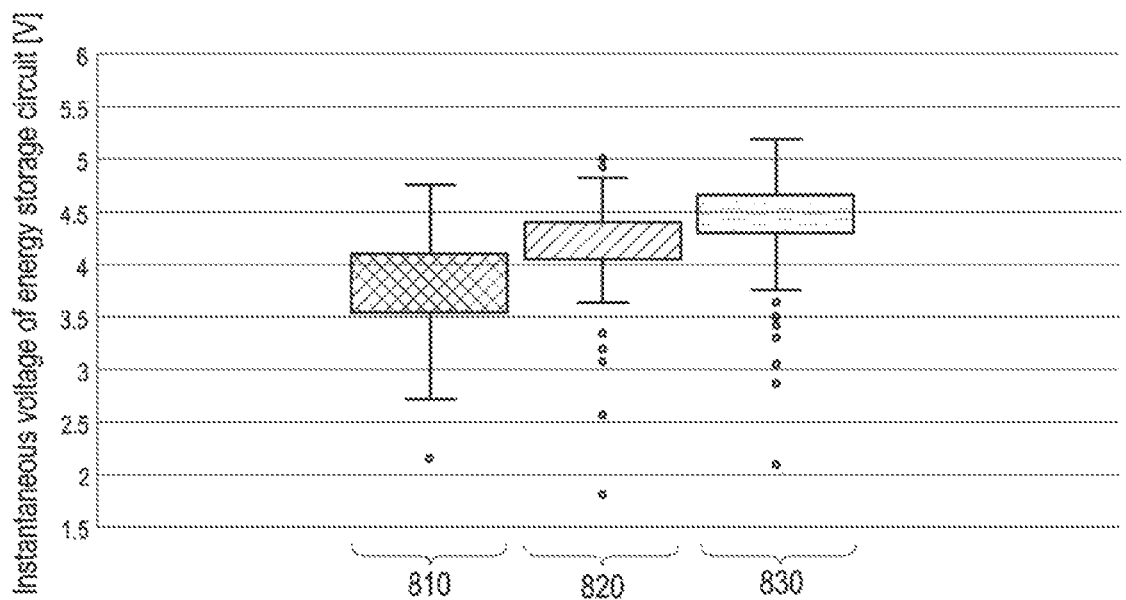
FIG. 8 is an illustration of a distribution of instantaneous voltages of an energy storage circuit according to various weights or volumes of laundry.

FIG. 8 is illustrating a distribution of instantaneous voltages of an energy storage circuit according to various weights or volumes of laundry. Specifically, while a drying machine (e.g., the electronic device 110) performs drying laundry in the state of including laundry (e.g., the laundry 120) and a sensor device (e.g., the sensor device 130), the sensor device may periodically identify an instantaneous voltage of an energy storage circuit, and may transmit the same to the drying machine. According to various embodiments, a period during which at least one processor of the sensor device identifies an instantaneous voltage of the energy storage circuit via a monitoring circuit may be shorter than a period during which the at least one processor of the sensor device transmits a signal indicating an instantaneous voltage of the energy storage circuit to the drying machine via a communication circuit. FIG. 8 illustrates a graph illustrating distributions of all data of instantaneous voltages of the energy storage circuit that the sensing device identifies and transmits to a drying machine from the start to the completion of drying. Specifically, a distribution 810 is a graph of distributions of instantaneous voltages of the energy storage circuit when the amount of laundry 120 is the maximum amount of laundry that the drying machine allows. A distribution 820 is a graph of distributions of instantaneous voltages of the energy storage circuit when the amount of laundry 120 is a first amount that is smaller than the maximum amount of laundry that the drying machine allows. A distribution 830 is a graph of distributions of instantaneous voltages of the energy storage circuit when the amount of laundry 120 is a second amount that is smaller than the first amount.

Referring to FIG. 8, it is identified that instantaneous voltages of the energy storage circuit are distributed at low voltage values when the amount of laundry 120 is large. Therefore, the sensor device 130 or the electronic device 110 may identify the amount of laundry 120 that is, the weight or volume of the laundry 120, based on an instantaneous voltage of the energy storage circuit.

Figure 9:
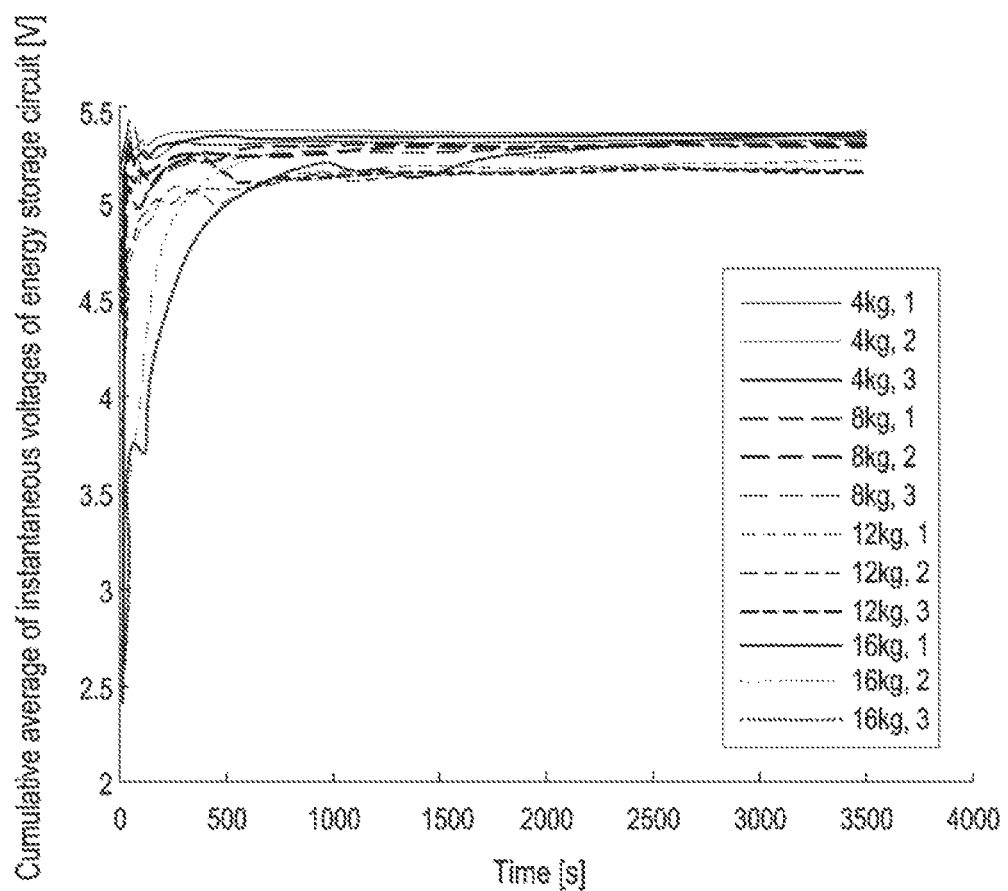
FIG. 9 is a graph illustrating the cumulative average of instantaneous voltages of an energy storage circuit according to various mass values of laundry.

FIG. 9 is illustrating the cumulative average of instantaneous voltages of an energy storage circuit according to various mass values of laundry. Specifically, FIG. 9 is a graph illustrating the cumulative average of instantaneous voltages of an energy storage circuit according to various mass values of laundry in the case that the sensor device 130 does not include the bleeder circuit 655 illustrated in FIG. 6 and does not control an operation mode based on a voltage of the energy storage circuit, like the description provided with reference to FIG. 10. Here, the cumulative average of instantaneous voltages of the energy storage circuit is a value obtained by cumulatively adding instantaneous voltage values of the energy storage circuit and dividing the same by the number of the added instantaneous voltage values. In the example of FIG. 9, 4 kg, 8 kg, 12 kg, and 16 kg are messes of the laundry 120, and 1, 2, and 3 denote which measurement, from among three times of measurement, performed with respect to the respective mass.

As described above with reference to FIGS. 2, 3A, and 3B, the energy harvester 210 of the sensor device 130 may produce electric energy when the electronic device 110 operates and the sensor device 130 moves. Therefore, as illustrated in FIG. 9, it is identified that the cumulative average of instantaneous voltages of the energy storage circuit tends to increase along with the operation of the electronic device 110 performed with respect to various mass values of laundry 120.

Referring to FIG. 9, in the case that the cumulative average of instantaneous voltages of the energy storage circuit is low, the distance between curves corresponding to different mass of the laundry 120 is relatively wide. In the case that the cumulative average of instantaneous voltages of the energy storage circuit is high, the distance between curves corresponding to different mass of the laundry 120 is narrow. In the case that the distance between curves is narrow, the accuracy may be limited when the sensor device 130 or the electronic device 110 identifies the mass of the laundry 120 based on the cumulative average of instantaneous voltages of the energy storage circuit. Particularly, in the case that the instantaneous voltage of the energy storage circuit is high, the cumulative average of instantaneous voltages of the energy storage circuit is increased. Accordingly, when the number of times of winding of a coil (e.g., the coil 320a) of a magnetic field induction harvester (e.g., the magnetic field induction harvester 300a) included in the sensor device 130 is high, or when the magnetic force of a magnet (e.g., the magnet 330a) of the magnetic field induction harvester 300a is strong, the accuracy may be limited when the sensor device 130 or the electronic device 110 identifies the mass of the laundry 120 based on the cumulative means of instantaneous voltages of the energy storage circuit. As illustrated in FIG. 3B, in the case that the sensor device 130 includes the single magnetic field induction harvester 300a, there may be a period in which electric energy is not produced along with a movement direction of the sensor device 130 during the entire time in which the electronic device 110 operates. In order to prevent the operation of a processor (e.g., the processor 270) of the sensor device 130 and the sensor 290 from stopping, the number of times of winding the coil 320a of the magnetic field induction harvester 300a is designed to be high or it is highly likely to adopt the magnet 330a having strong force. Therefore, in the case that the sensor device 130 includes the single magnetic induction harvester 300a, the accuracy may be limited when the sensor device 130 or the electronic device 110 identifies mass of the laundry 120 based on the cumulative average of instantaneous voltages of the energy storage circuit.

Figure 10:
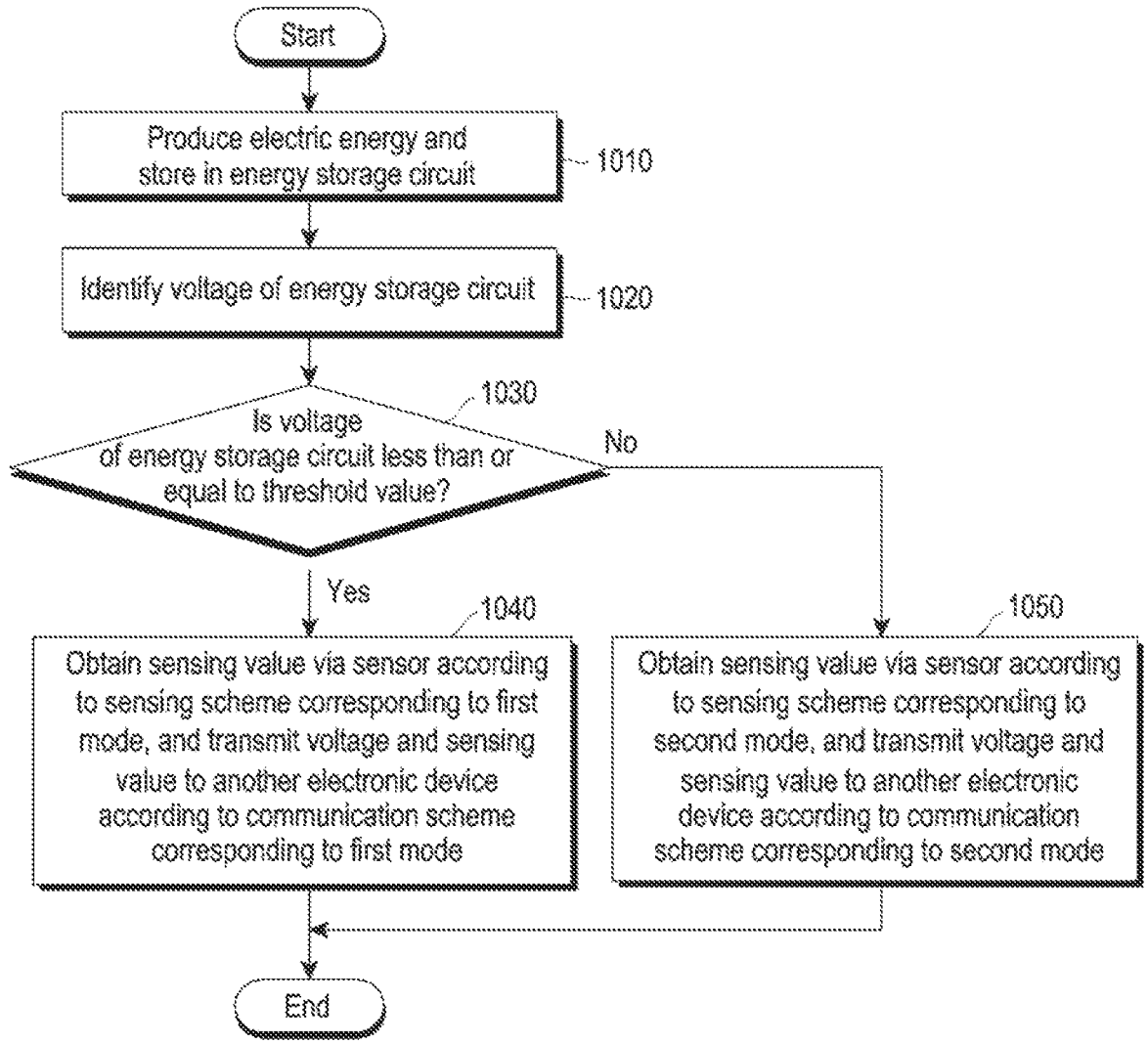
FIG. 10 is a diagram illustrating operations performed by a sensor device according to various embodiments.

FIG. 10 is a diagram illustrating operations performed by a sensor device according to various embodiments. Specifically, as described above with reference to FIG. 9, FIG. 10 illustrates operations performed for increasing the amount of power consumption when an instantaneous voltage of an energy storage circuit is high in a sensing device, in order to improve a problem in that accuracy is limited when the sensor device 130 or the electronic device 110 identifies the mass of laundry 120 based on the cumulative average of instantaneous voltages of an energy storage circuit.

In operation 1010, a sensor device (e.g., the sensor device 200) may produce electric energy via the energy harvester 210, and may store the produced electric energy in the energy storage circuit 230.

In operation 1020, at least one processor (e.g., the processor 270) of the sensor device (e.g., the sensor device 200) may identify a voltage of the energy storage circuit 230 via the monitoring circuit 280. According to various embodiments, operation 1020 may be performed periodically.

In operation 1030, at least one processor (e.g., the processor 270) of the sensor device (e.g., the sensor device 200) may identify whether a voltage of the energy storage circuit 230 is less than or equal to a threshold value. According to various embodiments, in the case when operation 1020 is periodically performed, the at least one processor 270 may identify whether the latest identified voltage value of the energy storage circuit 230 is less than or equal to the threshold value in operation 1030.

In the case that the voltage of the energy storage circuit 230 is identified as being lower than or equal to the threshold value in operation 1030, the at least one processor 270 may obtain a sensing value via the sensor 290 according to a sensing scheme corresponding to a first mode, and may transmit the voltage and the sensing value to another electronic device via the communication circuit 295 according to a communication scheme corresponding to the first mode.

According to various embodiments, the sensing value may be at least one of a temperature, a humidity, an acceleration, a change in a point of compass of the sensor device, the amount of detergent, a pH, a contamination level, a turbidity level, or odor.

In the case that the voltage of the energy storage circuit 230 is identified as exceeding the threshold value in operation 1030, the at least one processor 270 may obtain a sensing value via the sensor 290 according to a sensing scheme corresponding to a second mode, and may transmit the voltage and the sensing value to another electronic device via the communication circuit 295 according to a communication scheme corresponding to the second mode in operation 1040.

According to various embodiments, in the sensing scheme corresponding to the first mode, the at least one processor 270 may obtain a sensing value via the sensor 290 during a first sensing period. In the sensing scheme corresponding to the second mode, the at least one processor 270 may obtain a sensing value via the sensor 290 during a second sensing period.

According to various embodiments, in the communication scheme corresponding to the first mode, obtain a sensing value via the sensor 290 during a second sensing period.

In the communication scheme corresponding to the second mode, the at least one processor 270 may control the communication circuit 295 to transmit a voltage of the energy storage circuit 230 and a sensing value to another electronic device (e.g., the electronic device 110) during a second transmission period.

According to various embodiments, in the communication scheme corresponding to the first mode, the at least one processor 270 may control the communication circuit 295 to transmit a signal of a first intensity indicating a voltage of the energy storage circuit 230 and a sensing value to another electronic device (e.g., the electronic device 110). In the communication scheme corresponding to the second mode, the at least one processor 270 may control the communication circuit 295 to transmit a signal of a second intensity indicating a voltage of the energy storage circuit 230 and a sensing value to another electronic device (e.g., the electronic device 110).

According to various embodiments, the first sensing period in the first mode is identical to the second sensing period in the second mode. The first transmission period in the first mode is identical to the second transmission period in the second mode. The second intensity in the second mode may be stronger than the first intensity in the first mode. According to various embodiments, the first sensing period in the first mode is identical to the second sensing period in the second mode. The first transmission period in the first mode is longer than the second transmission period in the second mode. The first intensity in the first mode may be identical to the second intensity in the second mode. According to various embodiments, the first sensing period in the first mode is longer than the second sensing period in the second mode. The first transmission period in the first mode is identical to the second transmission period in the second mode. The first intensity in the first mode may be identical to the second intensity in the second mode.

According to various other embodiments, the first sensing period in the first mode is identical to the second sensing period in the second mode. The first transmission period in the first mode is longer than the second transmission period in the second mode. The second intensity in the second mode may be stronger than the first intensity in the first mode. According to various other embodiments, the first sensing period in the first mode is longer than the second sensing period in the second mode. The first transmission period in the first mode is identical to the second transmission period in the second mode. The second intensity in the second mode may be stronger than the first intensity in the first mode. According to various embodiments, the first sensing period in the first mode may be longer than the second sensing period in the second mode. The first transmission period in the first mode may be longer than the second transmission period in the second mode. The first intensity in the first mode may be identical to the second intensity in the second mode.

According to various other embodiments, the first sensing period in the first mode may be longer than the second sensing period in the second mode. The first transmission period in the first mode may be longer than the second transmission period in the second mode. The second intensity in the second mode may be stronger than the first intensity in the first mode.

As described in operation 1030 and operation 1040 of FIG. 10, after a voltage of the energy storage circuit 230 and a sensing value are transmitted to another electronic device (e.g., the electronic device 110), the other electronic device 110 may identify the weight or volume of the laundry 120 based on the voltage of the energy storage circuit 230. Alternatively, unlike operations 1030 and 1040, at least one processor 270 of the sensor device 200 may identify the weight or volume of the laundry 120 based on a voltage of the energy storage circuit 230 and may transmit a sensing value and the weight or volume of the laundry 120 to the other electronic device 110. In this instance, in the memory of the sensor device 200, a correspondence relationship between the weight or volume of the laundry 120 and a voltage of the energy storage circuit 230 or at least one parameter based on the voltage of the energy storage circuit 230 may be stored. According to various embodiments, at least one parameter based on a voltage of the energy storage circuit 230 may be at least one of the cumulative average of instantaneous voltages of the energy storage circuit 230, a first parameter to be described, or a second parameter to be described.

Although FIG. 10 illustrates that the sensor device 200 controls at least one of a sensing period, a transmission period, or an intensity of a transmitted signal, so as to control the amount of power consumption based on the voltage of the energy storage circuit 230, the sensor device 200 according to various embodiments includes the bleeder circuit 655, so as to increase the amount of power consumption when the voltage of the energy storage circuit 230 exceeds a Zener voltage of the Zener diode 657. In the case that the sensor device 200 includes the bleeder circuit 655, at least one processor 270 of the sensor device 200 may or may not perform operations illustrated in FIG. 10.

Figure 11:
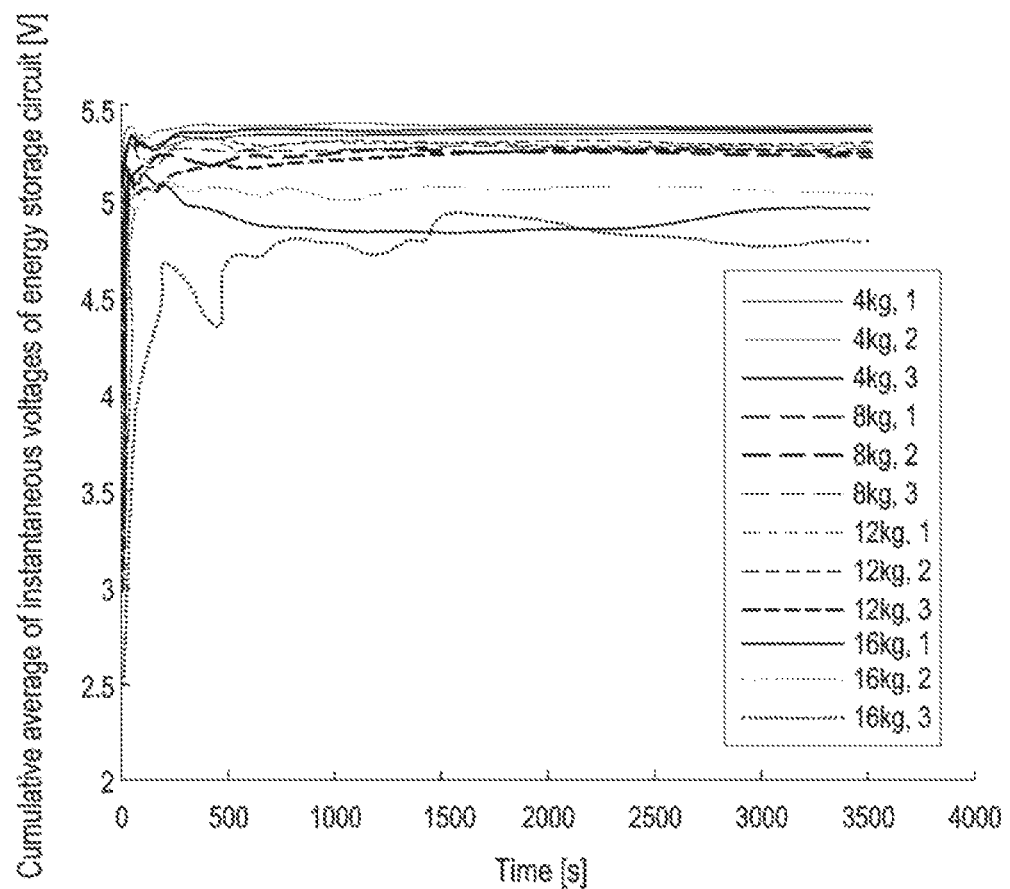
FIG. 11 is a graph illustrating the cumulative average of instantaneous voltages of an energy storage circuit according to various mass values of laundry when operations performed by a sensor device according to various embodiments are performed.

FIG. 11 is a graph illustrating the cumulative average of instantaneous voltages of an energy storage circuit according to various mass values of laundry when operations performed by a sensor device according to various embodiments are performed. Specifically, FIG. 11 is a graph illustrating the cumulative average of instantaneous voltages of an energy storage circuit according to various mass values of laundry when operations illustrated in FIG. 10 are performed, a threshold value is 4.5 V, a first sensing period in a first mode is 5 seconds, a second sensing period in a second mode is 250 ms, a first transmission period in the first mode is 15 seconds, a second transmission period in the second mode is 250 ms, a first intensity in the first mode and a second intensity in the second mode are identical.

Comparing with FIG. 9, it is identified that the distance between curves corresponding to different mass of laundry 120 is wide in FIG. 11. Therefore, when the operations illustrated in FIG. 10 are performed, the accuracy may be limited when the sensor device 130 or the electronic device 110 identifies the mass of the laundry 120 based on the cumulative average of instantaneous voltages of the energy storage circuit.

Figure 12:
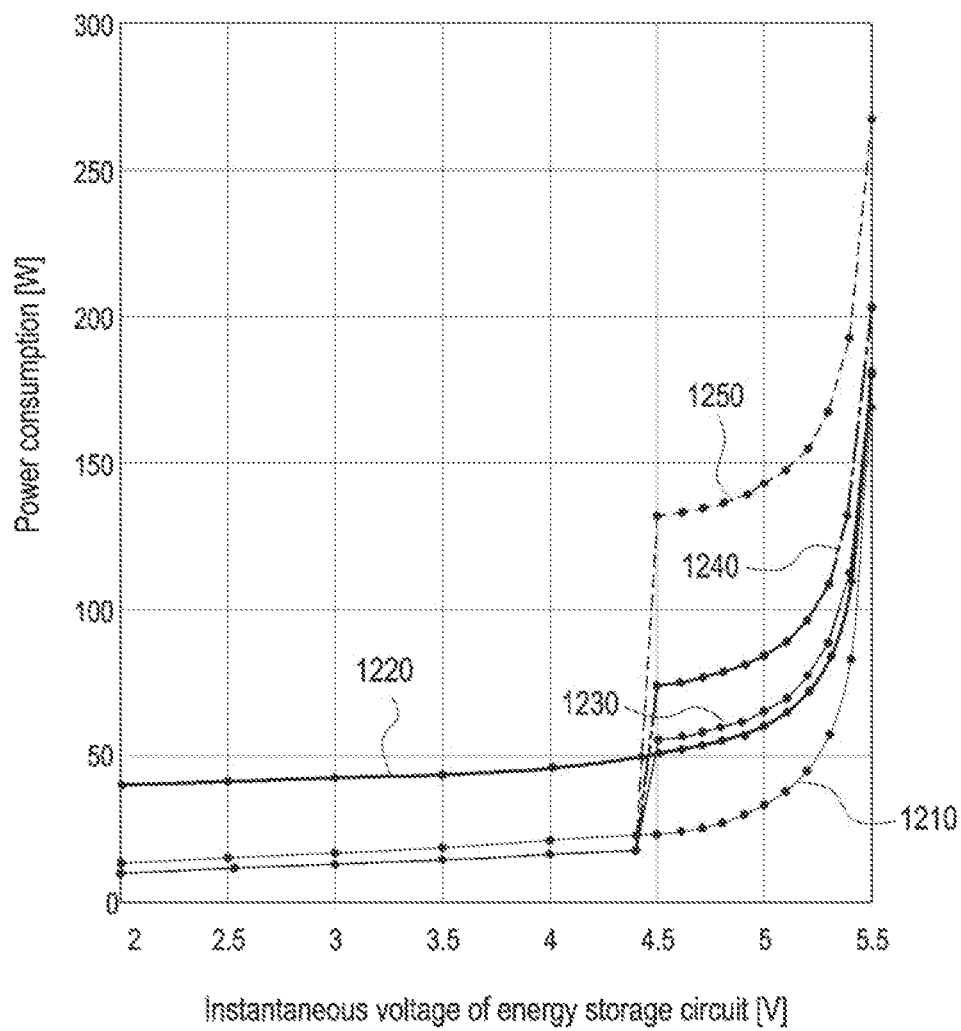
FIG. 12 is a graph illustrating power consumption according to a comparative example and various embodiments.

FIG. 12 is a graph illustrating power consumption according to a comparative example and various embodiments. A first curve 1210 illustrates a relationship between an instantaneous voltage of the energy storage circuit 230 and power consumption of the sensor device 200 when a sensing period during which the sensor device 130 identifies a sensing value via the sensor 290 is maintained as 5 seconds irrespective of a voltage of the energy storage circuit 230, when a period during which the sensor device 130 transmits a signal to the electronic device 110 is maintained as 5 seconds, when an intensity of a signal transmitted from the sensor device 130 to the electronic device 110 is constantly maintained. A second curve 1220 illustrates a relationship between an instantaneous voltage of the energy storage circuit 230 and power consumption of the sensor device 200 when a sensing period during which the sensor device 130 identifies a sensing value via the sensor 290 is maintained as 1 second irrespective of a voltage of the energy storage circuit 230, when a period during which the sensor device 130 transmits a signal to the electronic device 110 is maintained as 1 second, when an intensity of a signal transmitted from the sensor device 130 to the electronic device 110 is constantly maintained.

A third curve 1230 illustrates a relationship between an instantaneous voltage of the energy storage circuit 230 and power consumption of the sensor device 200 when the above-described threshold value in FIG. 10 is 4.5 V, a first sensing period is 5 seconds in a first mode, a second sensing period in a second mode is 0.75 seconds, a first transmission period in the first mode is 5 seconds, a second transmission period in the second mode is 0.75 seconds, and a first intensity in the first mode and a second intensity in the second mode are equal. A fourth curve 1240 illustrates a relationship between an instantaneous voltage of the energy storage circuit 230 and power consumption of the sensor device 200 when the above-described threshold value in FIG. 10 is 4.5 V, a first sensing period in the first mode is 5 seconds, a second sensing period in the second mode is 0.5 seconds, a first transmission period in the first mode is 5 seconds, a second transmission period in the second mode is 0.5 seconds, and a first intensity in the first mode and a second intensity in the second mode are equal. A fifth curve 1250 illustrates a relationship between an instantaneous voltage of the energy storage circuit 230 and power consumption of the sensor device 200 when the above-described threshold value in FIG. 10 is 4.5 V, a first sensing period in the first mode is 5 seconds, a second sensing period in the second mode is 0.25 seconds, a first transmission period in the first mode is 5 seconds, a second transmission period in the second mode is 0.25 seconds, and a first intensity in the first mode and a second intensity in the second mode are equal.

Referring to FIG. 12, in the first curve 1210 and the second curve 1220 in which a sensing period during which the sensing device 130 identifies a sensing value via the sensor 290 irrespective of a voltage of the energy storage circuit 230, a period during which the sensor device 130 transmits a signal to the electronic device 110, and an intensity of a signal that the sensor device 130 transmits to the electronic device 110 are constantly maintained, it is identified that an increase in the magnitude of power consumption is not discontinuous at the point in time at which a voltage of the energy storage circuit 230 is 4.5V. Conversely, in the third curve 1230, the fourth curve 1240, and the fifth curve 1250 in which a sensing period during which the sensor device 130 identifies a sensing value via the sensor 290 and a period during which the sensing device 130 transmits a signal to the electronic device 110 are changed at around the threshold value of 4.5 V, it is identified that an increase in the magnitude of power consumption is discontinuous.

Figure 13:
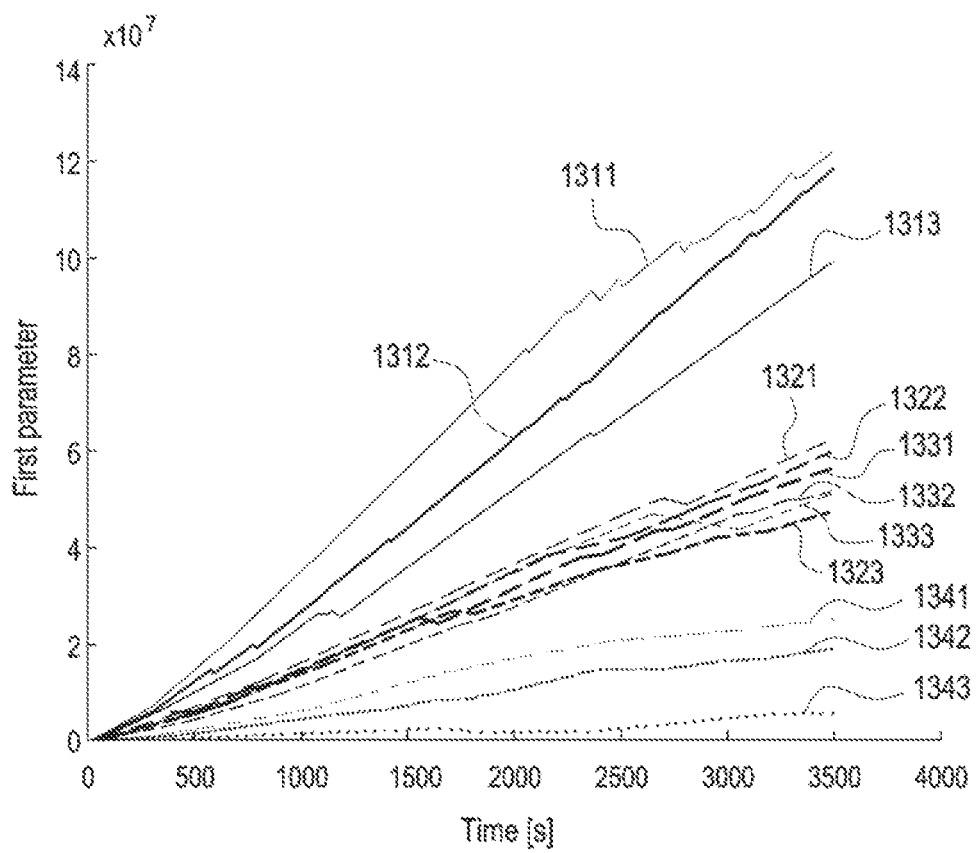
FIG. 13 is a graph illustrating a first parameter plotted over time according to various embodiments.

FIG. 13 is a graph illustrating a first parameter over time according to various embodiments. Specifically, FIG. 13 illustrates a first parameter plotted over time in the condition given in FIG. 11. The first parameter is a value obtained by dividing, by a variance of the voltage values of a plurality of energy storage circuits 230, the sum of voltage values of the plurality of energy storage circuits 230 collected after measurement starts. Curves 1311, 1312, and 1313 show first parameter values plotted over time when the mass of the laundry 120 is 4 kg. Curves 1321, 1322, and 1323 show first parameter values over time when the mass of the laundry 120 is 8 kg. Curves 1331, 1332, and 1333 show first parameter values plotted over time when the mass of the laundry 120 is 12 kg. Curves 1341, 1342, and 1343 show first parameter values plotted over time when the mass of the laundry 120 is 16 kg. It is identified that an inclination of a curve is small when the mass of the laundry 120 is high. Therefore, the electronic device 110 or the sensor device 130 may identify a first parameter value based on a voltage of the energy storage circuit 230, and may identify the weight or volume of the laundry 120 based on an increasing rate of the first parameter over time. In this instance, the electronic device 110 or the sensor device 130 may store a first correspondence relationship between an increasing rate of a first parameter over time and the weight or volume of the laundry 120 in a memory, and may identify the weight or volume of the laundry 120 with reference to the stored first correspondence relationship.

Figure 14:
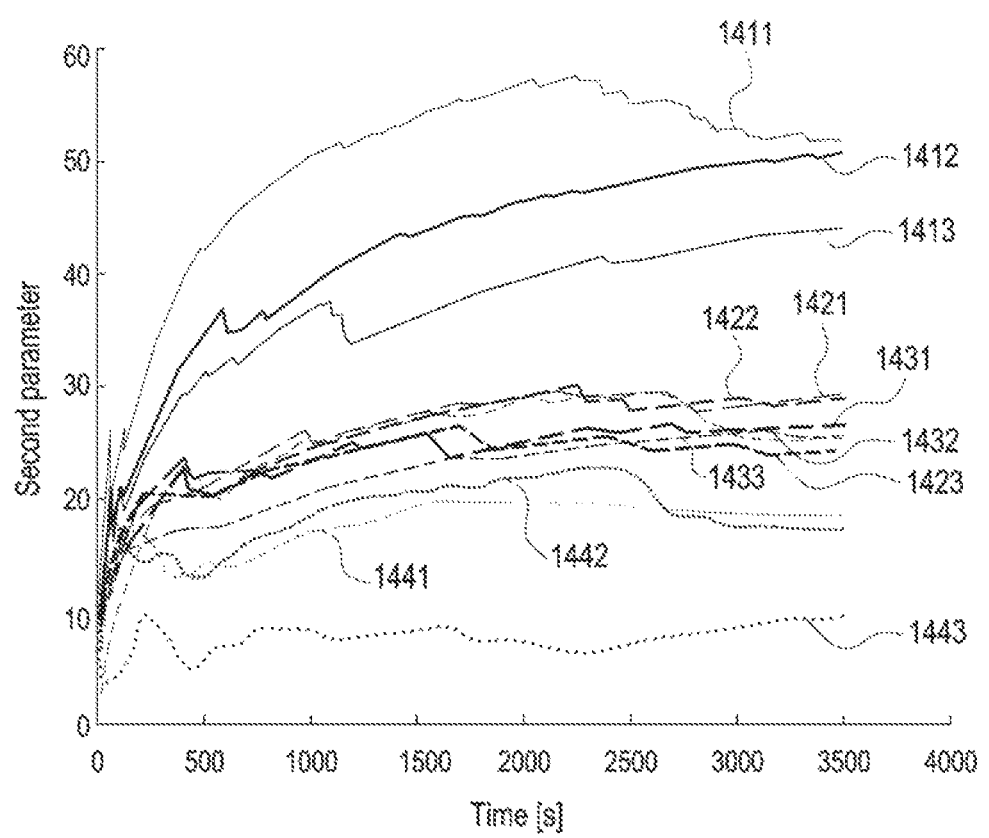
FIG. 14 is a graph illustrating a second parameter plotted over time according to various embodiments.

FIG. 14 is a graph illustrating a second parameter plotted over time according to various embodiments. Specifically, FIG. 14 illustrates a second parameter plotted over time in the condition given in FIG. 11. The second parameter is a value obtained by dividing, by the number of voltage values of a plurality of energy storage circuits 230, the sum of voltage values of the plurality of energy storage circuits 230 collected after measurement starts, and dividing the same by a variance of the voltage values of the plurality of energy storage circuits 230. Curves 1411, 1412, and 1413 show second parameter values plotted over time when the mass of the laundry 120 is 4 kg. Curves 1421, 1422, and 1423 show second parameter values plotted over time when the mass of the laundry 120 is 8 kg. Curves 1431, 1432, and 1433 show second parameter values plotted over time when the mass of the laundry 120 is 12 kg. Curves 1441, 1442, and 1443 show second parameter values plotted over time when the mass of the laundry 120 is 16 kg. It is identified that an inclination of a curve is small when the mass of the laundry 120 is high. Therefore, the electronic device 110 or the sensor device 130 may identify a second parameter value based on a voltage of the energy storage circuit 230, and may identify the weight or volume of the laundry 120 based on an increasing rate of the second parameter over time. In this instance, the electronic device 110 or the sensor device 130 may store a first correspondence relationship between an increasing rate of a second parameter over time and the weight or volume of the laundry 120 in a memory, and may identify the weight or volume of the laundry 120 with reference to the stored first correspondence relationship.

Figure 15:
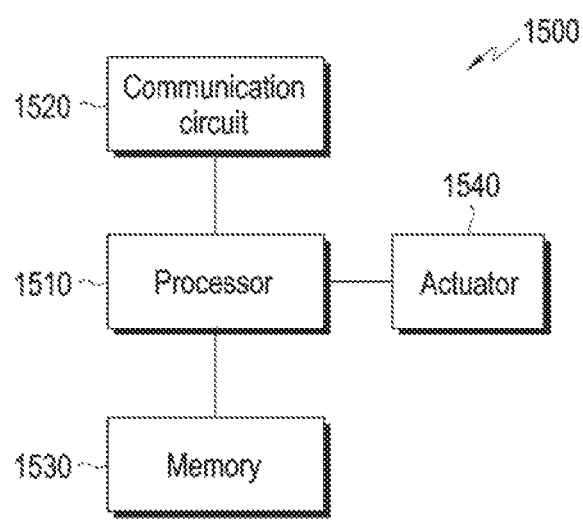
FIG. 15 is a block diagram of an electronic device according to various embodiments.

FIG. 15 is a block diagram of an electronic device according to various embodiments. Specifically, FIG. 15 is a block diagram of the electronic device 110 illustrated in FIG. 1. An electronic device 1500 may include a processor 1510, a communication circuit 1520, a memory 1530, and an actuator 1540.

According to various embodiments, the processor 1510 may be a single processor or may be a plurality of processors. The processor 1510 may execute, for example, software so as to control at least one other component element (e.g., a hardware or software component element) of the sensor device 200, and may perform various data processing or various operations. According to an embodiment, at least a part of the data processing or operations, the processor 1510 may load commands or data received from another component element (e.g., the sensor 290 or the communication circuit 295) in volatile memory, may process commands or data stored in the volatile memory, and may store result data in non-volatile memory. According to an embodiment, the processor 1510 may include a main processor (e.g., a central processing device or application processor), and a sub-processor that is capable of operating independently or together (e.g., a graphic processing device, an image signal processor, a sensor hub processor, or a communication processor). Additionally or alternatively, the sub-processor may be configured to use lower power than the main processor, or may be configured to specialized for a designated function.

According to various embodiments, the communication circuit 1520 may be used for receiving, from the sensor device 200, a signal indicating a sensing value obtained via the sensor 290 and indicating a voltage of the energy storage circuit 230 obtained via the monitoring circuit 280. According to various embodiments, the communication circuit 1520 may perform Bluetooth low energy (BLE), Bluetooth, Zigbee, Wi-Fi, infra-red (IR) communication. According to various embodiments, the communication circuit 1520 may be embodied as a chip identical to the processor 1510.

The communication circuit 1520 may support establishing a wireless communication channel between the electronic device 1500 and an external electronic device (e.g., the sensor device 130), and performing communication via the established communication channel. The communication circuit 1520 may include one or more communication processors that operate independently from the processor 1510 (e.g., an application processor), and supports wireless communication. According to an embodiment, the communication circuit 1520 may include a wireless communication circuit (e.g., a cellular communication circuit, a short-range wireless communication circuit, or a global navigation satellite system (GNSS) communication circuit). A corresponding communication circuit among the communication circuits may communicate with an external electronic device via a first network (e.g., a short-range communication network such as Bluetooth, WiFi direct, or infrared data association (IrDA)) or a second network (e.g., a long-range communication network such as a cellular network, the Internet, or a computer network (e.g., LAN or WAN)). Various types of communication circuits may be integrated as a single component element (e.g., a single chip), or may be embodied as a plurality of different component elements (e.g., a plurality of chips). A wireless communication circuit may identify and authenticate the sensor device 200 in a communication network such as a first network or a second network using subscriber information (e.g., international mobile subscriber identification (IMSI)) stored in a subscriber identification module.

The memory 1530 may store various data used by at least one component element (e.g., the processor 1510) of the electronic device 1500. Data may include, for example, input data or output data associated with software (e.g., the program) and a related command. The memory 1530 may include volatile memory and/or non-volatile memory. According to various embodiments, the memory 1530 may be embodied as a chip identical to the processor 1510 or the communication module 290*b*.

According to various embodiments, the memory 1530 may store at least one from among a first correspondence relationship between an increasing rate of a first parameter over time and the weight or volume of the laundry 120, a second correspondence relationship between an increasing rate of a second parameter over time and the weight or volume of the laundry 120, or a correspondence relationship between an increasing rate of the cumulative average of instantaneous voltages of the energy storage circuit 230 and the weight or volume of the laundry 120. In this instance, the processor 1510 may identify the first parameter, the second parameter, or the cumulative average of instantaneous voltages based on a voltage of the energy storage circuit 230 received via the communication circuit 1520, and may identify the weight or volume of the laundry 120 with reference to the correspondence relationship stored in the memory 1530. In addition, the processor 1510 may control an actuator based on at least one of the identified weight or volume of the laundry 120 or a sensing value.

According to various embodiments, the actuator 1540 may cause a mechanical movement using an electric signal transferred from the processor 1510. According to various embodiments, the electronic device 1500 may be a drying machine or a washing machine, and the actuator 1540 may include a motor embedded in the electronic device 1500.

According to various embodiments, the sensor device 200 may include an energy harvester 210 configured to produce electric energy, an energy storage circuit 230 configured to store the produced electric energy, a monitoring circuit 280, a sensor 290, a communication circuit 295, and at least one processor 270, wherein the at least one processor 270 may be configured to identify a voltage of the energy storage circuit 230 via the monitoring circuit 280, to operate in a first mode in response to identifying that the voltage is less than or equal to a threshold value, to operate in a second mode that consumes a higher amount of power than the first mode in response to identifying that the voltage exceeds the threshold value, to obtain a sensing value via the sensor 290 according to a sensing scheme corresponding to one of the first mode or the second mode, and to control the communication circuit 295 so as to transmit the voltage and the sensing value to another electronic device according to a communication scheme corresponding to one of the first mode or the second mode.

According to various embodiments, the at least one processor 270 may be configured to obtain the sensing value via the sensor 290 by a first sensing period according to a sensing scheme corresponding to the first mode, and the at least one processor 270 may be configured to obtain the sensing value via the sensor 290 by a second sensing period that is shorter than the first sensing period according to a sensing scheme corresponding to the second mode.

According to various embodiments, the at least one processor 270 may be configured to control the communication circuit 295 to transmit the voltage and the sensing value to the other electronic device during a first transmission period according to a communication scheme corresponding to the first mode, and the at least one processor 270 may be configured to control the communication circuit 295 to transmit the voltage and the sensing value to the other electronic device during a second transmission period that is shorter than the first transmission period according to a communication scheme corresponding to the second mode.

According to various embodiments the at least one processor 270 may be configured to control the communication circuit 295 to transmit a signal having a first intensity and indicating the voltage and the sensing value to the other electronic device according to a communication scheme corresponding to the first mode, and the at least one processor 270 may be configured to control the communication circuit 295 to transmit a signal having a second intensity greater than the first intensity and indicating the voltage and the sensing value to the other electronic device according to a communication scheme corresponding to the second mode.

According to various embodiments, the sensor device 200 may further include a bleeder circuit including an LED and a Zener diode, and the LED may be configured to emit light when the voltage exceeds the threshold value.

According to various embodiments, the energy harvester 210 may include a magnetic field induction harvester, and the magnetic field induction harvester may include a guide disposed in a housing of the sensor device 200, a magnet disposed to be movable in the guide according to a movement of the housing, and a coil winding around the guide, and the coil may include a single coil-wound portion in the guide or two or more coil-wound portions spaced apart in the guide.

According to various embodiments, the guide may be disposed in a straight direction, and the magnetic field induction harvester may include the single guide.

According to various embodiments, the energy harvester 210 may further include at least one from among a piezoelectric harvester, a thermoelectric harvester, a triboelectrification harvester, a photoelectric harvester, an RF harvester, a vibration energy harvester 210, a rotation energy harvester 210, or a kinetic energy harvester 210.

According to various embodiments, the sensor 290 may include at least one from among a temperature sensor, a humidity sensor, an acceleration sensor, a gyro sensor, a detergent amount sensor, a pH sensor, a contamination level sensor, a turbidity level sensor, or an odor sensor.

According to various embodiments, an electronic device 1500 may include a communication circuit 1520, an actuator 1540, and at least one processor 1510, and the at least one processor 1510 may be configured to receive a signal indicating a voltage of the energy storage circuit 230 and a sensing value obtained via the sensor 290, from the sensor device 200 including the energy harvester 210, the sensor 290, and the energy storage circuit 230 via the communication circuit 1520, the energy storage circuit 230 storing electric energy produced via the energy harvester 210, and based on at least one of the voltage and the sensing value, to control the actuator 1540 to process laundry.

According to various embodiments, when the voltage is less than or equal to a threshold value, the signal indicating the voltage and the sensing value is the sensing value obtained during a first sensing period, and when the voltage exceeds a threshold value, the signal indicating the voltage and the sensing value indicates the sensing value obtained during a second sensing period shorter than the first sensing period.

According to various embodiments, the at least one processor 1510 may be configured to receive the signal indicating the voltage and the sensing value during a first transmission period from the sensor device 200 via the communication circuit 1520 when the voltage is less than or equal to a threshold value, and to receive the signal indicating the voltage and the sensing value during a second transmission period shorter than the first transmission period from the sensor device 200 via the communication circuit 1520 when the voltage exceeds the threshold value.

According to various embodiments, the at least one processor 1510 may be configured to receive the signal having a first intensity and indicating the voltage and the sensing value from the sensor device 200 via the communication circuit 1520 when the voltage is less than or equal to a threshold value, and to receive the signal having a second intensity greater than the first intensity and indicating the voltage and the sensing value from the sensor device 200 via the communication circuit 1520 when the voltage exceeds the threshold value.

According to various embodiments, the sensing value may include at least one from among a temperature, a humidity, an acceleration, a change in a point of compass of the sensor device 200, a detergent amount, a pH, a contamination level, a turbidity level, or an odor.

According to various embodiments, the at least one processor 1510 may be configured to identify a weight or volume of the laundry based on the voltage, and based on at least one of the weight of the laundry, the volume or the laundry, and the sensing value, to control the actuator 1540 for processing the laundry.

According to various embodiments, the electronic device 1500 may further include the memory 1530, wherein the memory 1530 is configured to store a first correspondence relationship between an increasing rate of a first parameter, obtained by dividing a cumulative value of voltages by a variance of the voltages, over time and the weight or volume of the laundry, and the at least one processor 1510 is configured to identify the first parameter value, and to identify the weight or volume of the laundry based on the distribution of the first parameter value over time and the first correspondence relationship stored in the memory 1530.

According to various embodiments, the electronic device 1500 may further include the memory 1530, wherein the memory 1530 is configured to store a second correspondence relationship between an increasing rate of a second parameter, obtained by dividing a cumulative value of voltages by a variance of the voltages, over time and the weight or volume of the laundry, and the at least one processor 1510 is configured to identify the second parameter value, and to identify the weight or volume of the laundry based on the distribution of the second parameter value over time and the second correspondence relationship stored in the memory 1530.

According to various embodiments, a method performed in the sensor device 200 may include an operation of producing electric energy and storing the same in the energy storage circuit 230, an operation of identifying a voltage of the energy storage circuit 230, an operation of setting an operation mode to a first mode in response to identifying that the voltage is less than or equal to a threshold value, an operation of setting an operation mode to a second mode that consumes a higher amount of power than the first mode in response to identifying that the voltage exceeds the threshold value, an operation of obtaining a sensing value via the sensor 290 according to a sensing scheme corresponding to one of the first mode or the second mode, and an operation of transmitting, to another electronic device, the voltage and the sensing value according to a communication scheme corresponding to one of the first mode or the second mode.

According to various embodiments, the operation of obtaining the sensing value via the sensor 290 may include an operation of obtaining the sensing value during a first sensing period when the operation mode is the first mode, and an operation of obtaining the sensing value during a second sensing period that is shorter than the first sensing period when the operation mode is the second mode.

According to various embodiments, the operation of transmitting the voltage and the sensing value to the other electronic device may include an operation of transmitting the voltage and the sensing value to the other electronic device during a first transmission period when the operation mode is the first mode, and an operation of transmitting the voltage and the sensing value to the other electronic device during a second transmission period that is shorter than the first transmission period when the operation mode is the second mode.

It should be appreciated that various embodiments of the disclosure and the terms used therein are not intended to limit the technological features set forth herein to particular embodiments and include various changes, equivalents, or alternatives for a corresponding embodiment. With regard to the description of the drawings, similar reference numerals may be used to designate similar or relevant elements. A singular form of a noun corresponding to an item may include one or more of the items, unless the relevant context clearly indicates otherwise. As used herein, each of such phrases as "A or B," "at least one of A and B," "at least one of A or B," "A, B, or C," "at least one of A, B, and C," and "at least one of A, B, or C" may include all possible combinations of the items enumerated together in a corresponding one of the phrases. As used herein, such terms as "a first", "a second", "the first", and "the second" may be used to simply distinguish a corresponding element from another, and does not limit the elements in other aspect (e.g., importance or order). It is to be understood that if an element (e.g., a first element) is referred to, with or without the term "operatively" or "communicatively", as "coupled with/to" or "connected with/to" another element (e.g., a second element), it means that the element may be coupled/connected with/to the other element directly (e.g., wiredly), wirelessly, or via a third element.

As used herein, the term "module" may include a unit implemented in hardware, software, or firmware, and may be interchangeably used with other terms, for example, "logic," "logic block," "component," or "circuit". The "module" may be a minimum unit of a single integrated component adapted to perform one or more functions, or a part thereof. For example, according to an embodiment, the "module" may be implemented in the form of an application-specific integrated circuit (ASIC).

Various embodiments as set forth herein may be implemented as software including one or more instructions that are stored in a storage medium that is readable by a machine. For example, a processor of the machine may invoke at least one of the one or more stored instructions from the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each element (e.g., a module or a program) of the above-described elements may include a single entity or multiple entities. According to various embodiments, one or more of the above-described elements may be omitted, or one or more other elements may be added. Alternatively or additionally, a plurality of elements (e.g., modules or programs) may be integrated into a single element. In such a case, according to various embodiments, the integrated element may still perform one or more functions of each of the plurality of elements in the same or similar manner as they are performed by a corresponding one of the plurality of elements before the integration. According to various embodiments, operations performed by the module, the program, or another element may be carried out sequentially, in parallel, repeatedly, or heuristically, or one or more of the operations may be executed in a different order or omitted, or one or more other operations may be added.

What is claimed is:

1. A sensor device comprising:
   an energy harvester configured to produce electric energy;
   an energy storage circuit configured to store the produced electric energy;
   a monitoring circuit;
   a sensor;
   a communication circuit;
   memory storing instructions; and
   at least one processor,
   wherein the instructions, when executed by the at least one processor individually or collectively, cause the sensor device to:
   identify a voltage of the energy storage circuit via the monitoring circuit,
   operate in a first mode in response to identifying that the voltage is less than or equal to a threshold value,
   operate in a second mode that consumes a higher amount of power than the first mode in response to identifying that the voltage exceeds the threshold value,
   based on operating in the first mode, obtain a first sensing value via the sensor according to a first sensing scheme corresponding to the first mode and control the communication circuit to transmit the voltage and the first sensing value to an electronic device according to a communication scheme corresponding to the first mode, and
   based on operating in the second mode, obtain a second sensing value via the sensor according to a second sensing scheme corresponding to the second mode and control the communication circuit to transmit the voltage and the second sensing value to the electronic device according to a communication scheme corresponding to the second mode.

2. The sensor device of claim 1, wherein the instructions, when executed by the at least one processor individually or collectively, cause the sensor device to:
   based operating in the first mode, obtain the first sensing value via the sensor during a first sensing period according to the first sensing scheme, and
   based on operating in the second mode, obtain the second sensing value via the sensor during a second sensing period that is shorter than the first sensing period according to the second sensing scheme.

3. The sensor device of claim 1, wherein the instructions, when executed by the at least one processor individually or collectively, cause the sensor device to:

based on operating in the first mode, control the communication circuit to transmit the voltage and the first sensing value to the electronic device during a first transmission period according to a communication scheme corresponding to the first mode, and based on operating in the second mode, control the communication circuit to transmit the voltage and the second sensing value to the electronic device during a second transmission period that is shorter than the first transmission period according to a communication scheme corresponding to the second mode.

4. The sensor device of claim 1, wherein the instructions, when executed by the at least one processor individually or collectively, cause the sensor device to:

based on operating in the first mode, control the communication circuit to transmit the voltage and the first sensing value to the electronic device via a signal having a first intensity, and based on operating in the second mode, control the communication circuit to transmit the voltage and the second sensing value to the electronic device via a signal having a second intensity that is greater than the first intensity.

5. The sensor device of claim 1, further comprising:
a bleeder circuit comprising an LED and a Zener diode, wherein the LED is configured to emit light based on the voltage exceeding the threshold value.

6. The sensor device of claim 1,
wherein the energy harvester comprises a magnetic field induction harvester comprising:
  a guide disposed in a housing of the sensor device,
  a magnet configured to be movable in the guide according to a movement of the housing, and
  a coil winding around the guide, and
wherein the coil comprises at least one of a single coil-wound portion disposed within the guide or two or more coil-wound portions disposed within the guide and spaced apart from one another.

7. The sensor device of claim 6, wherein the guide is disposed in a straight direction, and the magnetic field induction harvester further comprises a single guide.

8. The sensor device of claim 6, wherein the energy harvester further comprises at least one from among a piezoelectric harvester, a thermoelectric harvester, a triboelectrification harvester, a photoelectric harvester, an RF harvester, a vibration energy harvester, a rotation energy harvester, or a kinetic energy harvester.

9. The sensor device of claim 1, wherein the sensor comprises at least one from among a temperature sensor, a humidity sensor, an acceleration sensor, a gyro sensor, a detergent amount sensor, a pH sensor, a contamination level sensor, a turbidity level sensor, or an odor sensor.

10. An electronic device comprising:
a communication circuit;
an actuator;
memory storing instructions; and
at least one processor,
wherein the instructions, when executed by the at least one processor individually or collectively, cause the electronic device to:
  receive, from a sensor device including an energy harvester, a sensor, and an energy storage circuit via the communication circuit, a signal indicating a voltage of the energy storage circuit and a sensing value obtained via the sensor, the energy storage circuit storing electric energy produced via the energy harvester, and
  based on at least one of the voltage and the sensing value, control the actuator to process laundry,
wherein a first sensing value is received as the sensing value according to a communication scheme corresponding to a first mode, and the first sensing value is obtained via the sensor according to a first sensing scheme according to the first mode in case that the voltage is less than or equal to a threshold value,
wherein a second sensing value is received as the sensing value according to a communication scheme corresponding to a second mode, and the second sensing value is obtained via the sensor according to a second sensing scheme according to the second mode in case that the voltage exceeds the threshold value, and
wherein the second mode consumes a higher amount of power than the first mode.

11. The electronic device of claim 10, wherein, the first sensing value is obtained by a first sensing period, and
the second sensing value is obtained by a second sensing period shorter than the first sensing period.

12. The electronic device of claim 10, wherein the instructions, when executed by the at least one processor individually or collectively, cause the electronic device is further configured to:
receive the signal indicating the voltage and the first sensing value by a first transmission period from the sensor device via the communication circuit in case that the voltage is less than or equal to the threshold value, and
receive the signal indicating the voltage and the second sensing value by a second transmission period shorter than the first transmission period from the sensor device via the communication circuit in case that the voltage exceeds the threshold value.

13. The electronic device of claim 10, wherein the instructions, when executed by the at least one processor individually or collectively, cause the electronic device is further configured to:
receive the signal having a first intensity and indicating the voltage and the first sensing value from the sensor device via the communication circuit in case that the voltage is less than or equal to the threshold value, and
receive the signal having a second intensity greater than the first intensity and indicating the voltage and the second sensing value from the sensor device via the communication circuit in case that the voltage exceeds the threshold value.

14. The electronic device of claim 10, wherein the sensing value comprises at least one from among a temperature, a humidity, an acceleration, a change in a point of compass of the sensor device, a detergent amount, a pH, a contamination level, a turbidity level, or an odor.

15. The electronic device of claim 10, wherein the instructions, when executed by the at least one processor individually or collectively, cause the electronic device is further configured to:
identify a weight or volume of the laundry based on the voltage, and
based on at least one of the weight of the laundry, the volume of the laundry, or the sensing value, control the actuator for processing the laundry.

* * * * *